(12) United States Patent
Braumann et al.

(10) Patent No.: US 10,816,489 B2
(45) Date of Patent: Oct. 27, 2020

(54) MONITORING DEVICE FOR THE MONITORING OF CHEMICAL REACTIONS BY MEANS OF MR MEASUREMENTS IN A FLOW CELL

(71) Applicant: Bruker BioSpin GmbH, Rheinstetten (DE)

(72) Inventors: Ernst Ulrich Braumann, Ettlingen (DE); Martin Hofmann, Bad Herrenalb (DE)

(73) Assignee: BRUKER BIOSPIN GMBH, Rheinstetten (DE)

( * ) Notice: Subject to any disclaimer, the term of this patent is extended or adjusted under 35 U.S.C. 154(b) by 260 days.

(21) Appl. No.: 15/812,708

(22) Filed: Nov. 14, 2017

(65) Prior Publication Data
US 2018/0136149 A1    May 17, 2018

(30) Foreign Application Priority Data
Nov. 15, 2016    (DE) .......................... 10 2016 222 363

(51) Int. Cl.
*G01N 24/00*    (2006.01)
*G01N 24/08*    (2006.01)
(Continued)

(52) U.S. Cl.
CPC ........... *G01N 24/088* (2013.01); *G01N 24/08* (2013.01); *G01N 24/085* (2013.01);
(Continued)

(58) Field of Classification Search
CPC . G01N 33/6848; G01N 33/6851; G01N 30/72
(Continued)

(56) References Cited

U.S. PATENT DOCUMENTS

| 4,246,537 A | 1/1981 | Laukien |
| 5,283,036 A * | 2/1994 | Hofmann ............... G01N 30/82 210/198.2 |

(Continued)

FOREIGN PATENT DOCUMENTS

EP    2407796 B1    1/2012

OTHER PUBLICATIONS

Dunn, Anna L., et al. "Enhancing Reaction Understanding with Online NMR Reaction Monitoring—Application to Chemical Route Development", Nov. 2016.
(Continued)

*Primary Examiner* — Natalia Levkovich
(74) *Attorney, Agent, or Firm* — Edell, Shapiro & Finnan, LLC

(57) ABSTRACT

A monitoring device is provided for analytical measurement of reaction fluid produced in a reaction vessel in a spectrometer with a monitoring cell. The distribution apparatus includes at least four supply and return lines that open into the distribution apparatus, wherein the distribution apparatus comprises a distribution device for distributing reaction fluid to the supply and return lines. The distribution apparatus comprises a distribution vessel in which the distribution device and an electrically controllable pump device for pumping of the reaction fluid are provided, wherein the distribution device comprises an electrically controllable valve device for distributing the reaction fluid to the lines that open into the distribution vessel. A control and regulating device for electrical control of the pump device and of the valve device is provided, wherein reaction control is prompt, automated, and optimized with respect to process parameters, and wherein temperature control may include the entire flow path.

20 Claims, 6 Drawing Sheets

(51) Int. Cl.
    *G01R 33/30*     (2006.01)
    *G01N 35/10*     (2006.01)
    *G01R 33/31*     (2006.01)

(52) U.S. Cl.
    CPC ....... *G01N 35/1095* (2013.01); *G01R 33/307* (2013.01); *G01R 33/31* (2013.01)

(58) Field of Classification Search
    USPC .................................. 436/173, 174; 422/70
    See application file for complete search history.

(56) References Cited

U.S. PATENT DOCUMENTS

| | | |
|---|---|---|
| 8,686,729 B2 | 4/2014 | Marquez et al. |
| 2016/0290941 A1 | 10/2016 | Hofmann |

OTHER PUBLICATIONS

Codina, Anna, "InsightMR—Hardware and Software for Reaction Monitoring" SMASH 2015, Bruker, Italy, 24 pages.
InsightMR team, "InsightMR User Manual Version 002 DRAFT" Bruker Corporation, Jun. 2016, 44 pages.
Maiwald et al., "Quantitative high-resolution on-line NMR spectroscopy in reaction and process monitoring", Journal of Magnetic Resonance 166 (2004), pp. 135-146.
Foley et al., "NMR Flow Tube for Online MNR Reaction Monitoring", Analytical chemistry, (2014), pp. 12008-12013.

\* cited by examiner

MONITORING DEVICE FOR THE MONITORING OF CHEMICAL REACTIONS BY MEANS OF MR MEASUREMENTS IN A FLOW CELL

CROSS REFERENCE TO RELATED APPLICATIONS

The following disclosure is based on and claims the benefit of and priority under 35 U.S.C. § 119(a) to German Patent Application No. 10 2016 222.363.1, filed Nov. 15, 2016, and the disclosure of which is incorporated in its entirety into the present application by reference.

FIELD OF THE INVENTION

An aspect of the invention relates to a monitoring device for conducting an analytical measurement of a reaction fluid produced in a reaction vessel in a spectrometer, wherein the monitoring device comprises the following assemblies:
a monitoring cell arranged in the spectrometer for receiving the reaction fluid to be measured in the spectrometer and transporting it back to the reaction vessel;
a distribution apparatus for distributing the reaction fluid between the monitoring cell and the reaction vessel comprising at least four supply and return lines, wherein the distribution apparatus comprises a distribution device for distributing the reaction fluid to the at least four supply and return lines that open into the distribution apparatus.

BACKGROUND

Aspects of the invention generally relate to continuous monitoring of reactions using analytical measurement, preferably by using magnetic resonance spectroscopy.

More particularly, NMR (nuclear magnetic resonance) spectroscopy is a widely used measurement method by which chemical compounds can be analyzed. In NMR spectroscopy, a sample to be measured in a sample tube is placed in a sample probe, which is measured using the NMR spectrometer.

Chemical reaction control is intended to optimize reaction parameters (e.g., temperature, pressure, solvent, catalyst, etc.) in order to shift the reaction equilibrium to the product side and/or to suppress reaction errors. In order to achieve continuous reaction control using NMR spectroscopy, samples must therefore be regularly taken, which entails considerable expense.

During sample transfer, the reaction conditions (such as temperature and pressure) must be maintained so that the sample to be measured is not altered. The time factor between sample collection and (NMR) measurement also plays a considerable role.

As the NMR spectrometer and the chemical reactor must necessarily be spatially separated, in reaction control in a closed system, the reaction mixture is continuously pumped from the reactor to the sample probe, where it is measured at regular intervals. In this case, the conditions prevailing in the transport system should be as close as possible to those in the reaction vessel, e.g., the reaction temperature.

U.S. Pat. No. 8,686,729 B2 or the parallel EP 2407796 B1 respectively describe a flow cell for chemical reaction control by using NMR spectroscopy ("fast loop" and "slow loop" principle). With the known device, the fluid reaction mixture is continuously pumped from the reactor to the NMR sample probe in the measuring device, where the fluid is measured. The known system functions with a total of four tubes coaxially arranged one inside the other, wherein the two inner capillaries form the transport capillaries for the reaction mixture. The two outer tubes are used for circulating a tempering fluid. Multiple connection sites are required to connect the four coaxial lines to their respective supply and return lines, which makes the system highly complex.

In NMR Flow Cell according to EP 2407796 B1, a manually adjustable reducing valve (split-function) is used in order to adjust the flow volume in the slow loop. As scaling above the position of the valve does not exist, nor is active measurement of the actual split-flow ratio between the fast loop and the slow loop even provided, calibration depends upon rough estimates or time-consuming test measurements. Changes in system conditions will always have a decisive effect on the split ratio and make renewed calibration under the new conditions necessary. As a rule, however, as conditions in reactions change by themselves, exact indication of the split ratio is either highly unsatisfactory or completely impossible.

An improved monitoring cell configured as an NMR flow cell is presented in DE 102015206030 B3. This is also used in the products cited above and marketed by the applicant, and among other advantages, allows a constant temperature to be maintained in the supply and return lines of the fluid measurement sample between the monitoring cell and the distribution apparatus in order to avoid influencing the thermal equilibrium. In this case, the system for sample collection is configured so simply that only a few known bonding or connecting sites that are readily commercially available are required, wherein existing facilities can be easily retrofitted.

A monitoring device with a monitoring cell configured as an NMR-flow cell became known for example from the article "Enhancing Reaction Understanding with Online NMR Reaction Monitoring—Application to Chemical Route Development" by Anna L. Dunn, Anna Codina, David A. Foley and Mark T. Zell, published on the internet site of the applicant in November 2016 at <https://www.bruker-.com/fileadmin/user_upload/8-PDF-Docs/MagneticResonance/NMR/brochures/T158434_EnhancingReactionMonitoring.pdf>.

The article published on the same site by Anna Codina entitled "Insight NMR—Hardware and Software for Reaction Monitoring", which was presented by the author at the international conference SMASH 2015 in Baveno, Italy, also provides insight into the technical structure and functioning of such a monitoring device. The accompanying product, the "InsightMR Flow Unit", has been marketed by the applicant.

However, the following points are disadvantageous in all previously known generic monitoring devices:

At present, automation of the course of the experiment is not possible with any known arrangement. More particularly, the distribution device for distributing reaction fluid is ordinarily composed of a simple manual valve, which makes intervention by an operator indispensable. More particularly, regulation, for example, computer-controlled, of the reaction and/or measuring process or even selected process parameters is therefore impossible according to the prior art. There is therefore no system control currently available, and certainly no complete system control. Neither the pumps and the valves nor the temperature can be adjusted to meet the required conditions, at least not without manual intervention in each case. More particularly, if temperature conditions need to be automatically adapted/modified during a reaction or the reaction must/should be stopped or adapted based on the results currently provided by the spectrometer, this is impossible at present because of the lack of status responses.

As already described in DE 102015206030 B3, there are many connection sites that could potentially constitute risk sources for leaks. These should be reduced, however, despite increasing complexity, to a minimum. In the known arrangement, moreover, the transfer capillary is relatively long at 4 to 7 m, depending on the field strength of the magnet. This means that internal volumes and also the transfer time are unnecessarily high. In reactions that take place over a period of minutes, however, this can already result in undesirable changes.

Finally, among the known generic monitoring devices, the entire flow path of the reaction fluid is not temperature-controllable in any case, but at best sections thereof. Temperature control of the distribution apparatus itself is neither provided nor even possible with the known arrangement. There are currently neither temperature nor pressure sensors available in order to ensure operational safety.

SUMMARY

In contrast, an object of the present invention, which, when considered in detail, is relatively demanding and complex, is to allow reaction control that is largely automated and can also be specifically optimized with respect to selected process parameters in a monitoring device of the type described above using inexpensive, readily obtainable components, wherein a reaction sample is provided shortly before the chemical reaction takes place for analytical measurements in the spectrometer, the measurement (either in progress or stopped) is started, and optionally, further steps for controlling the chemical reaction can be promptly taken based on the current measurement result. These steps can initiate, for example, further dosing steps, modification of the course of the reaction, or simply termination of the reaction. The reaction may be configured in a software-controlled, automated, and highly reproducible manner. Finally, a possibility for temperature control should be provided that preferably includes the entire flow path of the collected reaction fluid, including the pumps involved in the process and essential components of the distribution apparatus, wherein the monitoring device should be spatially configured to be as compact as possible.

An object of the invention is achieved in a way that is as surprising as it is effective, in that the distribution apparatus comprises a distribution vessel in which the distribution device and an electrically controllable pump device for pumping of the reaction fluid are arranged, in that the distribution device comprises an electrically controllable valve device for distributing the reaction fluid to the at least four supply and return lines that open into the distribution vessel, and in that a control and regulating device for electrical control of the pump device and for electrical control of the valve device is present.

More particularly, the following advantages are achieved by aspects of the present invention:

Placement of the distribution apparatus according to aspects of the invention in a common distribution vessel makes the system particularly compact and space-saving, and on the other hand, it is this arrangement that makes it possible to provide the most extensive temperature control possible, and ultimately, temperature control of the central system components. Otherwise, it would be necessary to individually insulate all of the movable capillaries, lines, connections, and valves, as well as the pump(s), if they were not arranged in a common vessel. A further advantage is provided by the compact design, more particularly with respect to the power required, which can now be provided by a single power supply for the pumps and electrical valves. Moreover, the solution according to aspects of the invention, in contrast to the "decentralized" configurations common in the prior art, opens up the possibility of overall positioning of such a compact box in the spatial proximity of the spectrometer, which gives rise to the additional advantages described below.

The required electrical controllability of the valve device for distributing reaction fluid constitutes a vital step away from manual operation of the equipment and moves toward allowing the measuring process to take place in automated fashion and allowing the conditions of the monitored reaction to be actively influenced, again in automated fashion, depending on determinable framework values and selected parameters. By installing sensors and detectors, as will be explained in further detail below, the latter can be observed in real time and thus incorporated into active process control and even process regulation. However, the complex data on the course of the process obtained in this manner can also be utilized in other ways.

The actual automation, as well as the control and regulation, fully implements the control and regulating device according to aspects of the invention for electrical control of the pump device and the valve device.

This control and regulation substantially increase operating safety for users, equipment, and the environment. Reading of the sensors and processing of the values make it possible, by using suitable software, to take into account aspects relevant to safety and react correspondingly in order to prevent damage of any kind.

Reading of the sensors and processing of the values also make it possible, by using suitable software and responding accordingly, to achieve higher reproducibility and comparability of the measurement data.

In preferred embodiments, the monitoring device according to aspects of the invention, wherein the electrically controllable valve device for distributing reaction fluid comprises a switchable four-way valve, which in a first operating position ("on flow") can connect the supply line from the reaction vessel to the distribution vessel, directly or indirectly, with the supply line from the distribution vessel to the monitoring cell, and the return line from the monitoring cell to the distribution vessel, directly or indirectly, with the return line from the distribution vessel to the reaction vessel, and which in a second operating position ("stopped flow") can connect the supply line from the reaction vessel to the distribution vessel, directly or indirectly, with the return line from the distribution vessel to the reaction vessel, and the supply line from the distribution vessel to the monitoring cell, directly or indirectly, with the return line from the monitoring cell to the distribution vessel.

A variety of analysis conditions can be covered with a 4-way, 2-position, 2-L valve: in an "on flow" condition, particularly rapid reaction changes can be measured, which are influenced in the reactor by addition of a reactant or modification of the reaction conditions, such as, for example, reducing or increasing the temperature.

In the "stopped flow" position, the course of the reaction (kinetics) of a non-moving sample can be measured. This is highly advantageous in slow reactions taking place over periods of minutes or hours. These measurements are substantially more stable, because the sample does not move.

A first class of advantageous embodiments is characterized in that the electrically controllable pump device for pumping of the reaction fluid comprises only a single pump. Such a particularly simple system can be sold at a lower price. Although "on flow" and "stopped flow" modes are also possible, this makes the transfer time from the reactor to the monitoring cell substantially longer, as in this case the flow rates of the pump cannot be set as high as desired (higher flow rates cause high system pressure and inferior measurement results in the magnet). At flow rates of 3 ml/min and higher, a clear NMR signal reduction is already visible. With this system, therefore, it is only useful to investigate reactions that are in the range of several minutes or more. The system therefore has certain limitations.

Alternatively, in a further class of embodiments, the electrically controllable pump device for pumping of the reaction fluid comprises a transportation path pump, which can pump reaction fluid from the supply line running from the reaction vessel to the distribution vessel to the return line running from the distribution vessel to the reaction vessel, and the pump device additionally comprises a measurement path pump, which can pump at least one partial stream of the reaction fluid conveyed by the transportation path pump into the valve device for distributing the reaction fluid to the at least four supply and return lines that open into the distribution vessel.

Using such a two-pump system, the transfer time from the reactor to the monitoring cell is substantially shorted, as in this case the flow rate of the transportation path pump can be (as) high (as desired). Rates of 15 ml/min and above are possible. The circulation time of the sample from the reactor to the pump and back is only a few seconds. This has no effect on system pressure or the measurement result in the magnet. The measurement path pump, which is located close to the monitoring cell, collects a specified sample volume from the transportation path or continuously conveys the sample to the monitoring cell at an adjusted lower flow rate. At flow rates below 3 ml/min, virtually no NMR signal reduction is visible. As the internal volume in the measurement path is substantially lower than in the transportation path, this yields a measurement result that is substantially closer to the time of the reaction in the reaction vessel than in the above-described simpler version having only one pump. With this system, therefore, one can also investigate reactions that are in a range of <1 minute.

Particularly preferred are improvements of this class of embodiments in which a first distribution piece, more particularly a first T piece, is arranged in the flow path of the conveyed reaction fluid downstream of the transportation path pump, which diverts a partial stream of the reaction fluid conveyed by the transportation path pump to the measurement path pump and diverts a further partial stream to the return line from the distribution vessel to the reaction vessel, and wherein a further distribution piece, more particularly a further T piece, is arranged in the flow path of the conveyed reaction fluid upstream of the return line from the distribution vessel to the reaction vessel, which combines the partial stream of the reaction fluid conveyed by the transportation path pump to the return line from the distribution vessel to the reaction vessel and a partial stream of reaction fluid exiting the valve device and diverts said combined stream to the return line from the distribution vessel to the reaction vessel.

A T piece is the simplest form of distributor. In this case, one could also use a 3-way 2-position 1-L valve, but this would entail additional control and mechanical expense without providing substantial added value.

Further advantageous embodiments are characterized in that the parts of the pump device moistened with reaction fluid and the valve device, as well as the entire fluid path of the reaction fluid, are composed of chemically inert materials, more particularly glass, PTFE (polytetrafluoroethylene), PCTFE (polychlorotrifluoroethylene), or ETFE (ethylene tetrafluoroethylene).

The manufacturer of such a system does not know in advance which reactions will be required by customers using the device. However, the manufacturer would like to cover the widest possible range of applications. These applications may be water-related, in which for example living organisms are investigated, or may be reactions under extreme pH conditions. They may take place under extreme temperature conditions, or radical, corrosive reagents such as, for example, CFCs or other organic solvents, which react with many plastics and metals. For this reason, materials should be selected for the moistened contact area that show resistance to the highest possible number of chemicals used in the laboratory.

A further preferred embodiment of the monitoring device according to aspects of the invention is characterized in that the pump device, the valve device, and the entire fluid path of the reaction fluid are composed of materials that are usable in an operating temperature range of $-50°$ C. to $+150°$ C., and preferably $-20°$ C. to $+100°$ C. This allows practical use of the invention in virtually all conceivable applications.

Particularly preferred are improvements of the above-described second class of embodiments in which at least one pump of the electrically controllable pump device for pumping of the reaction fluid, preferably the transportation path pump, is configured such that it can be operated at a flow rate of 10 to 1,000 ml/min.

The transportation path pump can therefore run at a high flow rate (>20 ml/min), which allows more rapid circulation between the reactor pump and the reactor.

Also advantageous are improvements of the above-described second class of embodiments in which at least one pump of the electrically controllable pump device for pumping of the reaction fluid, preferably the measurement path pump, is configured such that it can be operated at a flow rate of 0.1 to 10 ml/min.

The measurement path pump can therefore run at a low flow rate (<1 ml/min). This makes precise sample volumes and improved MR measurement conditions in the "on flow" mode possible.

Most particularly preferred are embodiments of the invention in which the control and regulating device for electrical control of the pump device and for electrical control of the valve device is configured such that it allows independent flow and volume control, and more particularly, independent control of the transportation path pump and the measurement path pump, depending on the course of the reaction in the reaction vessel.

In the prior art, all of the modules present in the system are independent and can only be controlled separately. There is no communication among the individual components (reactor, thermostat; pump(s), valve, spectrometer), which allow only approximate automation. There are no reaction-dependent actions that automatically initiate transfer of the sample and starting/stopping of measurement. However, as a reaction is dynamic, and one must/wishes to respond to reaction processes if necessary, communication and active control are indispensable. This applies not only to a reaction in the reaction vessel and in the monitoring cell, but also to conditions inside the system. For example, pressure (obstruction or leakage), temperature (min ° C., max ° C.), and pH must be measured at various selected sites so that countermeasures can be taken if needed. In order to allow this, sensors are placed at selected sites that monitor pressure, temperature, and pH.

Equally preferred are embodiments of the monitoring device according to the invention in which the control and regulating device for electrical control of the pump device and the valve device is configured such that it allows time-controlled and/or volume-controlled regulation of the valve device and/or the pump device depending on the course of the reaction in the reaction vessel.

Volume control makes it possible to collect a specified volume, which the sample exchanges in the monitoring cell and makes available for renewed measurement in the spectrometer. This in turn allows rapid minimized provision of the sample in the monitoring cell. Time control allows regular collection of the sample from the transportation path or reactor at nn time intervals in order to follow the course of slow reactions with reduced measurements. This can be used to carry out measurement of the current reaction status, for example every 5 minutes, until no further changes are observed and the reaction can be considered to have been carried out fully and is thus completed.

Further, particularly advantageous embodiments of the invention are characterized in that the distribution vessel is enclosed in a housing configured to be thermally insulating.

Specifically, many chemical reactions are highly temperature-dependent. If the temperature in the system is incorrect, reactions can take place more slowly than required, stop or proceed more rapidly than desired, or byproducts can precipitate and block the transfer or measuring path. In order to avoid cold or hot bridges and keep losses in temperature control of the system to a minimum, all of the parts through which the sample flows should therefore be correspondingly insulated.

It would be very complex from a structural standpoint to separately insulate the capillaries and their connections to the valves, the valves themselves, and the pump heads (not the motors). Structurally, it is substantially more practical to arrange the entire apparatus (distribution apparatus) in a housing and to control the temperature of this housing as an overall space.

In a further class of particularly preferred embodiments of the monitoring device according to the invention, a thermostat device is therefore additionally provided, by which the entire flow path of the reaction fluid conveyed from the reaction vessel via the distribution vessel to the monitoring cell and back can be subjected to temperature control, more particularly active temperature control.

Particularly preferred are improvements of this class of embodiments in which the control and regulating device for electrical control of the pump device and for electrical control of the valve device is configured such that it allows temperature control of the thermostat device depending on the course of the reaction in the reaction vessel.

Further advantageous embodiments are characterized in that the distribution vessel is spatially arranged closer to the monitoring cell than to the reaction vessel, wherein more particularly, the distance between the distribution vessel and the reaction vessel can be twice, preferably three times, and more particularly six times as large as the distance between the distribution vessel and the monitoring cell.

The position of the monitoring device should always be selected such that it is located as close as possible to the measuring site (spectrometer). In MR systems with small magnets, the ratio (distance from reactor to distribution vessel:distance from distribution vessel to monitoring cell) can be approx. 3:1. In high field magnets (<600 MHz), however, it can also be 6:1.

As a rule, the sensor system is an important component of a monitoring device according to aspects of the invention in the sense of automation and sufficient operating safety: its purpose is to monitor the system and respond to reaction processes. These interdependencies, and the ever-present task of increasing/ensuring the safety of the system, will generally make the use of—diversely configurable—sensors necessary for monitoring the reaction and increasing the operating safety of the system.

Such sensors should be used in a monitoring device according to aspects of the invention, among other purposes,
in order to allow communication for automated MR measurement (start/stop) depending on the course of the reaction;
in order to allow temperature control of the thermostat;
in order to allow current actual values for temperature monitoring in the system to be read and corresponding actions for regulation of the thermostats to be taken; and
in order to allow current actual values for internal temperature monitoring of the various circuits to be read and corresponding actions at the pumps for regulating the flow rates to be taken, which serve to provide increased safety, up to and including an emergency shutdown.

Thus, for example, one should place pH sensors in the reactor, temperature sensors in the reactor, the distribution device, the thermostat, and the spectrometer, pressure sensors downstream of the pump in the transportation path, downstream of the pump in the measuring path, and so on.

The use of further sensors such as, for example, IR sensors, Raman sensors, UV sensors, etc. can also be desirable, with said sensors also being conceivable as additional information sources.

The use of a system with the above-described features according to aspects of the invention for the reaction control of a chemical reaction using NMR spectroscopy also falls within the scope of present invention embodiments.

Further advantages of the invention are presented in the description and the drawing. The above-mentioned features and those explained in further detail below can also be used according to the invention either individually or in a plurality of desired combinations. The embodiments described and shown are not to be understood as an exhaustive list, but are given solely by way of example in order to describe aspects of the invention.

BRIEF DESCRIPTION OF THE DRAWINGS

Aspects of the invention are depicted in the drawing and explained in further detail by examples. The figures show the following.

DETAILED DESCRIPTION

Figure 1A:
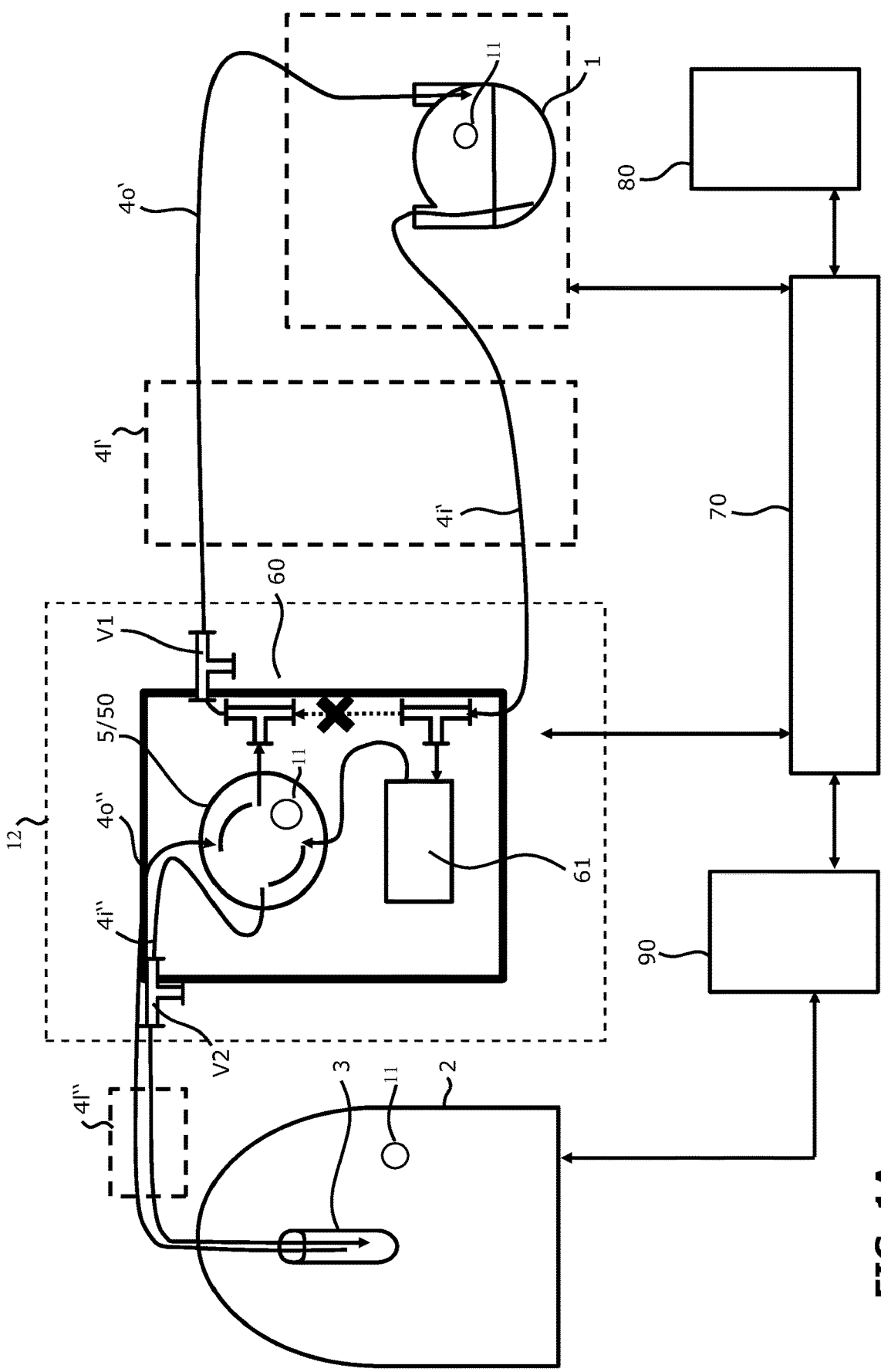
FIG. 1A is a schematic diagram of a simple embodiment of the monitoring device according to an aspect of the invention with only one pump and without a temperature control device in the "on flow" position.

FIGS. 1A to 3 of the drawing show respective schematic views of a preferred embodiment of the monitoring device according to an aspect of the invention. A generic monitoring device according to the prior art is shown in FIG. 4.

The monitoring device is used for conducting an analytical measurement in a spectrometer 2 of a reaction fluid produced in a reaction vessel 1, and more particularly for monitoring a chemical reaction by using MR spectroscopy.

The monitoring device comprises the following assemblies:
a monitoring cell 3 arranged in the spectrometer 2 for receiving the reaction fluid to be measured in the spectrometer 2 and transporting it back to the reaction vessel 1; a distribution apparatus 12 for distributing the reaction fluid between the monitoring cell 3 and the reaction vessel 1, in which at least two lines $4i'$, $4o'$ for the supply 41' of reaction fluid from the reaction vessel 1 to the distribution apparatus and for the return $4o'$ thereof from the distribution apparatus to the reaction vessel 1 and at least two further lines $4i'''$, $4o''$ for the supply 41'' of reaction fluid from the distribution apparatus to the monitoring cell 3 and for the return $4o''$ thereof from the monitoring cell 3 to the distribution apparatus, wherein the distribution apparatus comprises a distribution device 5/50 for distributing reaction fluid to the at least four supply and return lines $4i'$, $4o'$, $4i'''$, $4o''$ that open into the distribution apparatus.

The monitoring device according to aspects of the invention is characterized in that the distribution apparatus 12 has a distribution vessel 60 in which the distribution device 5/50 and an electrically controllable pump device 61; (see also, FIG. 1B. 62a, 62b) for pumping of the reaction fluid are arranged such that the distribution device 5/50 comprises an electrically controllable valve device 50 for distributing reaction fluid to the at least four supply and return lines $4i'$, $4o'$, $4i'''$, $4o''$ that open into the distribution vessel 60, and such that that a control and regulating device 70 for electrical control of the pump device 61; 62a, 62b and for electrical control of the valve device 50 is present.

The electrically controllable valve device 50 can comprise both an electrically and a pneumatically controlled valve. However, position control remains electrical for both valve types. In the latter case, the control-pressurized gas is supplied to the valve according to the desired position via an electrically controlled valve.

The parts of the pump device moistened with reaction fluid 61; 62a, 62b and the valve device 50, as well as the entire fluid path of the reaction fluid, are as a rule composed of chemically inert materials, more particularly glass, PTFE (polytetrafluoroethylene), PCTFE (polychlorotrifluoroethylene), or ETFE (ethylene tetrafluoroethylene).

In the flow path of the return line $4o'$ for reaction fluid from the distribution apparatus to the reaction vessel 1, a first pressure relief valve V1 is installed at the outlet from the distribution vessel 60 for protection against harmful excess pressure buildup. In addition, a further pressure relief valve V2 is provided in the supply line $4i'''$ from the distribution apparatus to the monitoring cell 3.

In the monitoring device according to aspects of the invention, as shown in FIGS. 1A to 3, the electrically controllable valve device 50 for distributing reaction fluid can comprise a switchable four-way valve, which, in a first operating position ("on flow" position), connects the supply line $4i'$ from the reaction vessel 1 to the distribution vessel 60 with the supply line $4i'''$ from the distribution vessel 60 to the monitoring cell 3 and connects the return line $4o''$ from the monitoring cell 3 to the distribution vessel 60 with the return line $4o'$ from the distribution vessel 60 to the reaction vessel 1, and in a second operating position ("stopped flow" position), connects the supply line $4i'$ from the reaction vessel 1 to the distribution vessel 60 with the return line $4o'$ from the distribution vessel 60 to the reaction vessel 1 and connects the supply line $4i'''$ from the distribution vessel 60 to the monitoring cell 3 with the return line $4o''$ from the monitoring cell 3 to the distribution vessel 60.

Figure 1B:
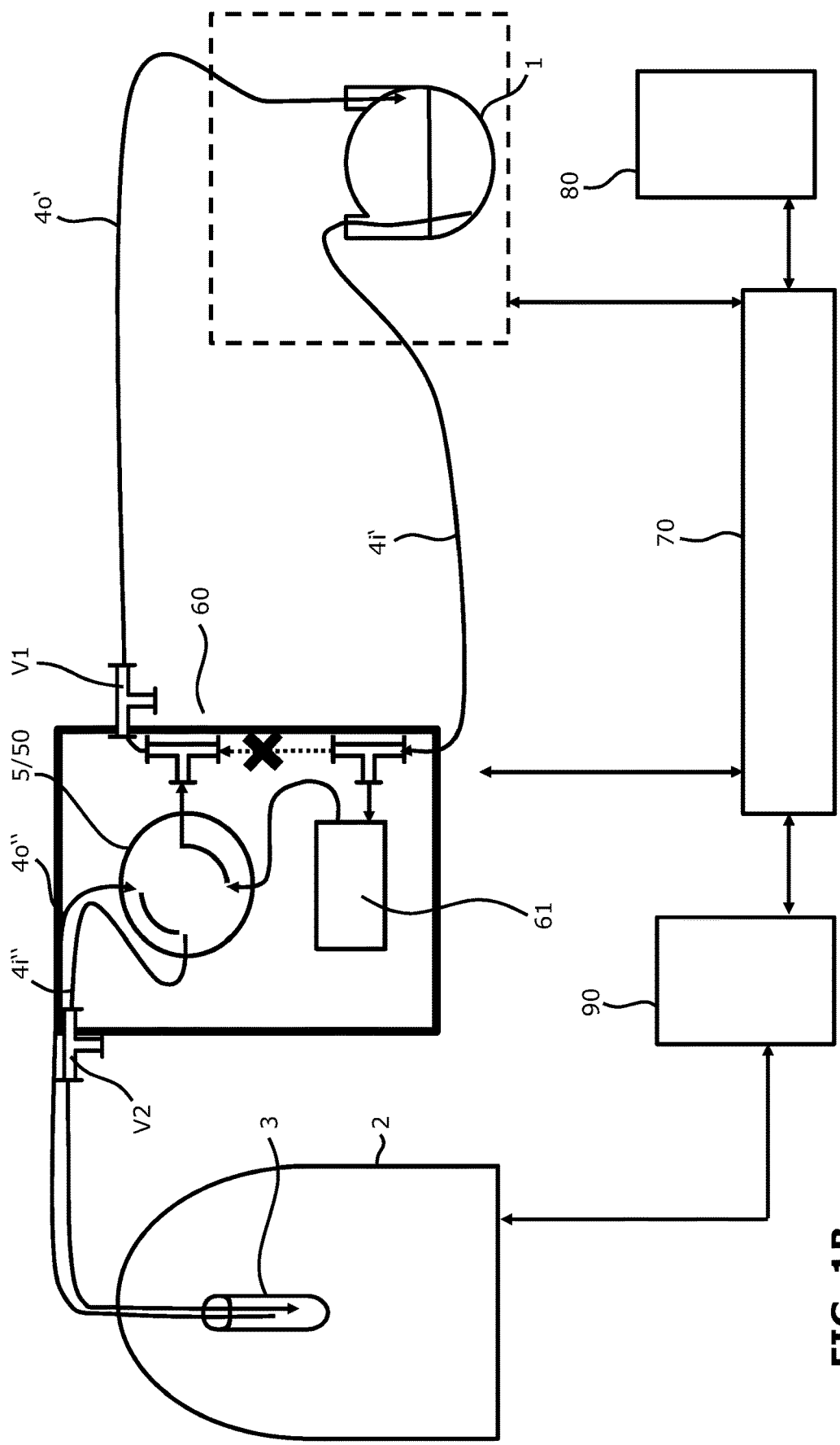
FIG. 1B shows the system according to FIG. 1A in the "stopped flow" position.

In an embodiment of the monitoring device according to aspects of the invention shown in FIG. 1A ("on flow" position) and FIG. 1B ("stopped flow" position), the electrically controllable pump device for pumping of the reaction fluid comprises only a single pump 61.

Figure 2A:
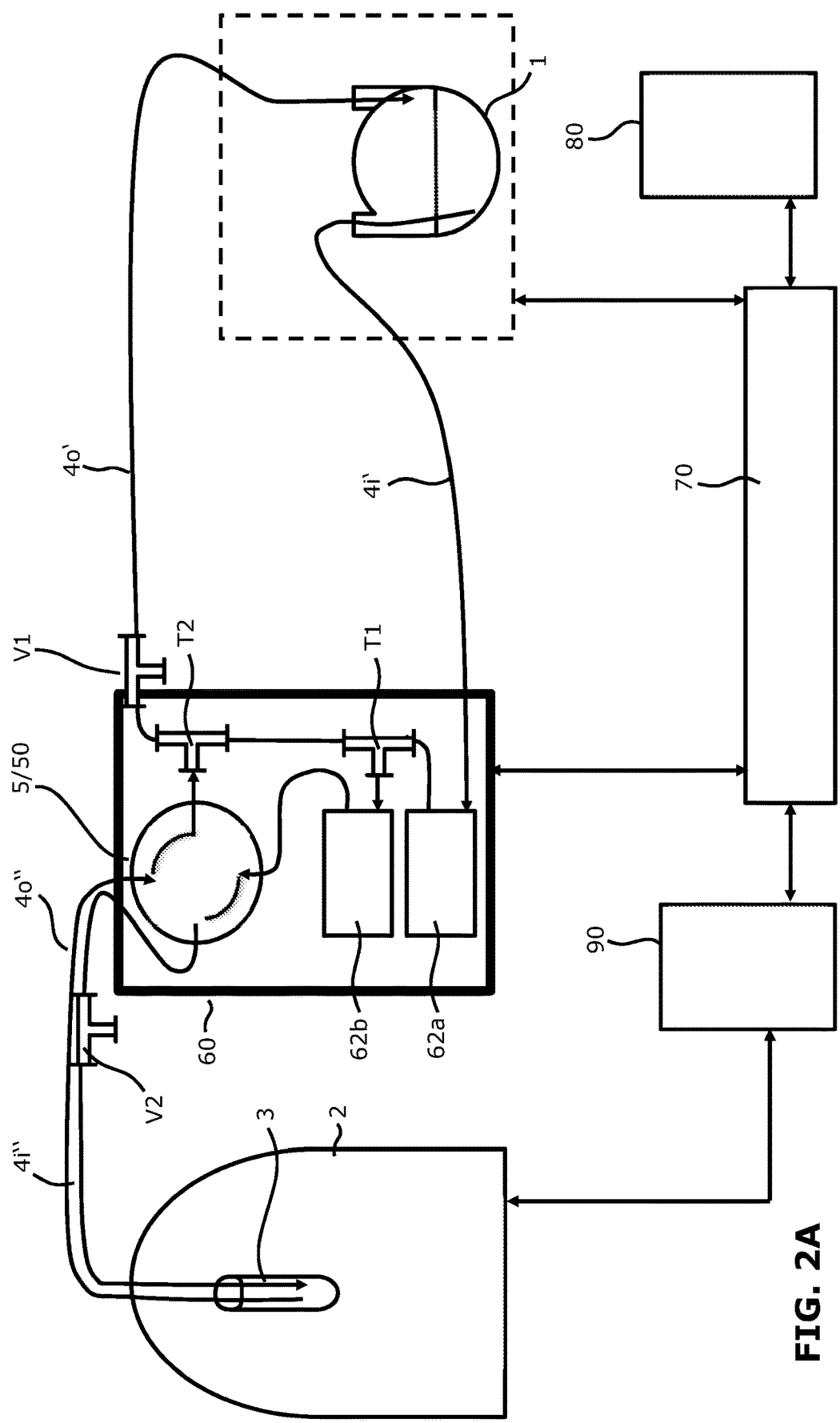
FIG. 2A is a schematic diagram of an embodiment of the monitoring device according to an aspect of the invention with two pumps (again shown without a temperature control device) in the "on flow" position.
Figure 2B:
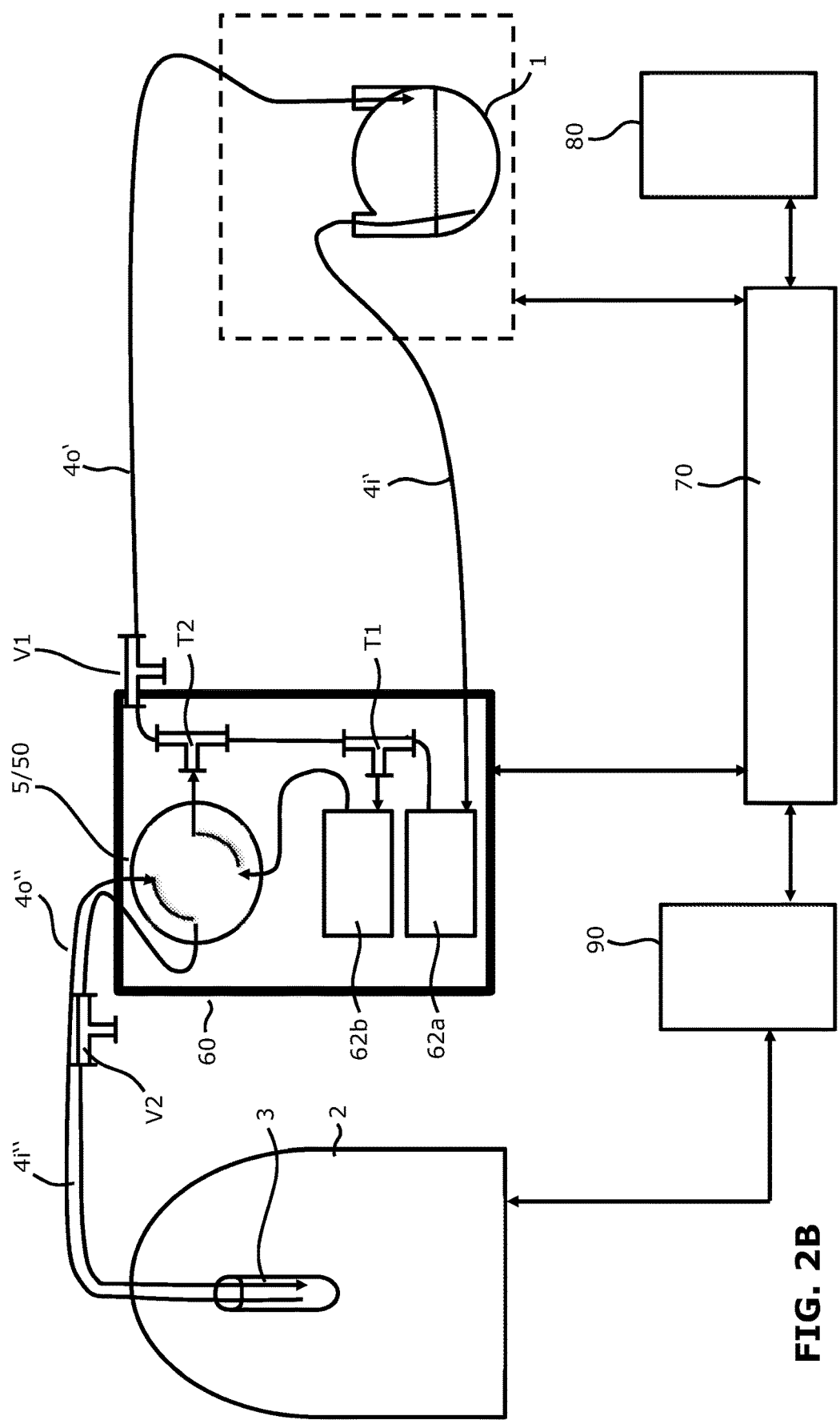
FIG. 2B shows the system according to FIG. 2A in the "stopped flow" position.

In another embodiment of the monitoring device according to aspects of the invention shown in FIG. 2A ("on flow" position) and FIG. 2B ("stopped flow" position), the electrically controllable pump device for pumping of the reaction fluid comprises a transportation path pump 62a, which pumps reaction fluid from the supply line $4i'$ from the reaction vessel 1 to the distribution vessel 60 to the return line $4o'$ from the distribution vessel 60 to the reaction vessel 1, as well as a measurement path pump 62b, which conveys at least one partial stream of the reaction fluid conveyed by the transportation path pump 62a into the valve device 50 for distributing reaction fluid to the at least four supply and return lines $4i'$, $4o'$, $4i'''$, $4o''$ that open into the distribution vessel 60.

In this embodiment, as shown for the improvement according to FIG. 2A and FIG. 2B, a first distribution piece, more particularly a first T piece T1, can be arranged in the flow path of the conveyed reaction fluid downstream of the transportation path pump 62a, which diverts a partial stream of the reaction fluid conveyed by the transportation path pump 62a to the measurement path pump 62b and a further partial stream to the return line $4o'$ from the distribution vessel 60 to the reaction vessel 1, as well as a further distribution piece, more particularly a further T piece (T2) arranged in the flow path upstream of the return line $4o'$ from the distribution vessel 60 to the reaction vessel 1, which combines the partial stream of the reaction fluid conveyed by the transportation path pump 62a to the return line $4o'$ from the distribution vessel 60 to the reaction vessel 1 and a partial stream of reaction fluid exiting the valve device 50 and diverts this combined stream to the return line $4o'$ from the distribution vessel 60 to the reaction vessel 1.

In all of the embodiments of the monitoring device according to aspects of the invention shown in the drawing, the distribution vessel 60 is enclosed by a housing that is configured to be thermally insulating. In addition, a thermostat device 80 is present by which the entire flow path of the conveyed reaction fluid from the reaction vessel 1 via the distribution vessel 60 to the monitoring cell 3 and back can be subjected to temperature control, more particularly active temperature control, wherein the control and regulating device 70 for electrical control of the pump device 61; 62a, 62b and for electrical control of the valve device 50 is configured such that it allows temperature control of the thermostat device 80, depending on the course of the reaction in the reaction vessel 1.

Figure 3:
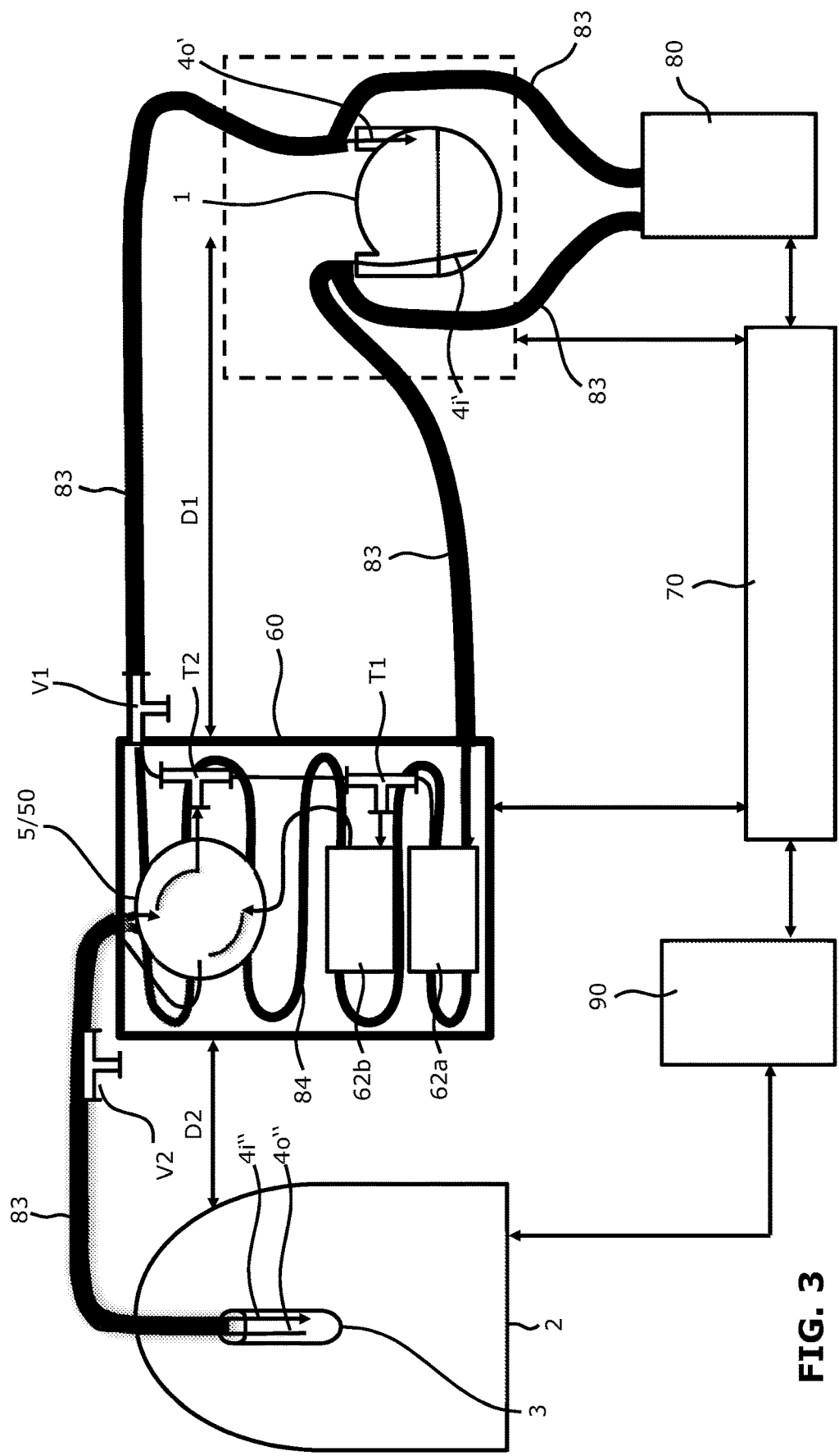
FIG. 3 is a schematic diagram of the embodiment according to FIG. 2A, but with a temperature control device and thermal insulation of the entire flow path of the conveyed reaction fluid from the reaction vessel via the distribution vessel to the monitoring cell and back.
Figure 4:
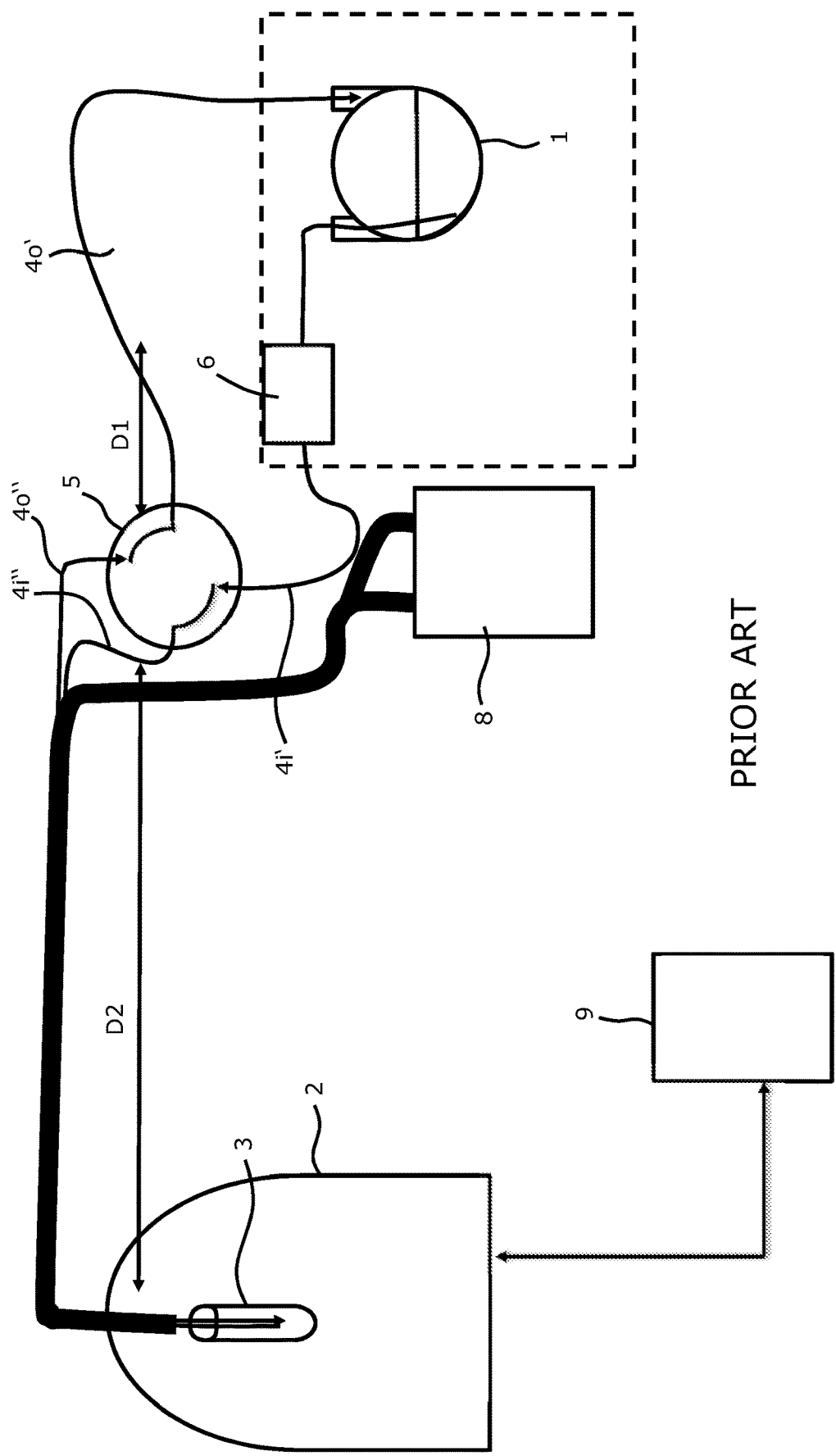
FIG. 4 is a schematic diagram of a monitoring device according to the prior art.

As indicated in FIG. 3 (by correspondingly thick lines), the supply and return lines $4i'$, $4o'$, $4i'''$, $4o''$ for the reaction fluid are surrounded by thermal insulation 83 over the entire flow path, at least outside of the distribution vessel 60, which itself is already insulated.

The thermostat circuit and its active temperature control inside the thermal insulation 83 extends not only to the lines 4*i*', 4*o*', 4*i*" and 4*o*", but also to a thermal transfer device 84 in the thermally insulated distribution vessel 60. This thermal transfer device 84 is preferably integrated into the thermostat circuit with a tube that is suitable for temperature transfer (copper, aluminum, etc.). Alternatively, this task can also be carried out by an electrical Peltier element.

The pump device 61: 62*a*, 62*b*, the valve device 50, and the entire flow path of the reaction fluid are composed of materials that can be used in an operating temperature range of −50° C. to +150° C., and preferably −20° C. to +100° C. The system can also be used at temperatures of −40° C. to +120° C., and more particularly −10° C. to +60° C.

The control and regulating device 70 for electrical control of the pump device 61: 62*a*, 62*b* and for electrical control of the valve device 50 is configured such that it allows independent flow and volume control, more particularly independent control of the transportation path pump 62*a* and the measurement path pump 62*b*, as well as, additionally or alternatively, time-controlled and/or volume-controlled regulation of the valve device 50 and/or the pump device 61; 62*a*, 62*b*, depending on the course of the reaction in the reaction vessel 1.

In the flow path of the conveyed reaction fluid, preferably at different, spatially separate sites, sensors 11, shown in FIG. 1 of the present drawing, are arranged for detection of the current temperature and/or the current pressure and/or the current pH and/or the current flow rate of the reaction fluid, which are connected to the control and regulating device 70 for electrical control of the pump device 61; 62*a*, 62*b* and for electrical control of the valve device 50. The control and regulating device 70 is configured such that it allows temperature-controlled and/or pressure-controlled and/or pH-controlled and/or flow-rate-controlled regulation of the valve device 50 and/or the pump device 61; 62*a*, 62*b*, depending on the course of the reaction in the reaction vessel 1.

The control and regulating device 70 communicates with a computer 90, and can cause the starting or stopping of NMR measurements by use of suitable software interactions. If necessary, via feedback from the NMR software, reaction conditions in the reactor 1 can be modified/adapted, and a new NMR measurement can be triggered under the new modified conditions.

Finally, FIG. 4 shows a schematic illustration of the monitoring device with an NMR flow cell known from prior art, as discussed in detail above and marketed by the applicant as the commercial product "InsightMR Flow Unit".

In contrast to the monitoring device accordingly to aspects of the present invention, in which an electrically controllable valve device 50 for distributing reaction fluid is specified as compulsory, in this case, only a simple manual valve is provided, which by no means can be electrically controlled, but must be activated by an operator.

The control and regulating device 70, which is also compulsory for the monitoring device according to the invention, is completely absent.

In this system according to prior art, a pump 6 for conveying the reaction fluid to be measured is arranged outside a distribution vessel, in the environment of the reaction vessel 1.

Moreover, although a so-called chiller 8 is provided in the prior art with which the flow path of the reaction fluid can be temperature-controlled in a section between the distribution device 5 and the spectrometer 2, this is by no means possible over the entire flow path.

It is true that in the system according to the prior art, the spectrometer 2 can be controlled via a computer 9 (as a rule a PC) by suitable software (here: NMR software). In the monitoring device according to aspects of the invention, however, spectrometer control is carried out via the calculating unit 90, which in turn is controlled by the control and regulating device 70, thus opening up a wide variety of also automated possibilities for influencing the spectrometer 2 depending on the current measurement data supplied to the control and regulating device 70 from the above-described probes/detectors.

Finally, it can also be seen from FIGS. 1A to 3 that the distribution vessel 60 is spatially arranged closer to the monitoring cell 3 than to the reaction vessel 1, wherein in practice, more particularly, the distance D1 between the distribution vessel 60 and the reaction vessel 1 can be twice, preferably three times, and more particularly six times as large as the distance D2 between the distribution vessel 60 and the monitoring cell 3. In contrast, this distance ratio is exactly opposite in the prior art, as can be seen for example from FIG. 4.

What is claimed is:

1. A monitoring device for conducting an analytical measurement of a reaction fluid comprising:
   a reaction vessel containing the reaction fluid;
   a spectrometer for measuring the reaction fluid;
   a monitoring cell arranged in the spectrometer for receiving the reaction fluid to be measured in the spectrometer and transporting the reaction fluid back to the reaction vessel;
   a distribution apparatus for distributing the reaction fluid between the monitoring cell and the reaction vessel, comprising a distribution device, coupled to a first supply line and a first return line for supplying the reaction fluid from the reaction vessel to the distribution device and for returning the reaction fluid from the distribution device to the reaction vessel, and coupled to a second supply line and a second return line for supplying the reaction fluid from the distribution device to the monitoring cell and for returning the reaction fluid from the monitoring cell to the distribution device, and
   a control and regulating device,
   wherein:
   the distribution apparatus comprises a distribution vessel which houses the distribution device and an electrically controlled pump device configured to pump the reaction fluid,
   the distribution device comprises an electrically controlled valve device configured to distribute the reaction fluid to the first and the second supply lines and to the first and the second return lines,
   each of the supply lines and the return lines open into the distribution vessel, and
   the control and regulating device is configured to electrically control the pump device and the valve device.

2. The monitoring device as claimed in claim 1, wherein the electrically controlled valve device configured to distribute the reaction fluid comprises a switchable four-way valve, which in a first operating position ("on flow"), connects the first supply line from the reaction vessel to the distribution vessel, directly or indirectly, with the second supply line from the distribution vessel to the monitoring cell and the second return line from the monitoring cell to the distribution vessel, directly or indirectly, with the first return line from the distribution vessel to the reaction vessel, and which, in a second operating position ("stopped flow"), connects the first supply line from the reaction vessel to the distribution vessel, directly or indirectly, with the first return line from the distribution vessel to the reaction vessel and the second supply line from the distribution vessel to the monitoring cell, directly or indirectly, with the second return line from the monitoring cell to the distribution vessel.

3. The monitoring device as claimed in claim 1, wherein the electrically controlled pump device configured to pump the reaction fluid comprises a single pump.

4. The monitoring device as claimed in claim 1, wherein the electrically controlled pump device configured to pump the reaction fluid comprises a transportation path pump, which is fluidly connected to the first supply line from the reaction vessel and pumps reaction fluid through the distribution vessel to the first return line from the distribution vessel to the reaction vessel, and wherein the electrically controlled pump device additionally comprises a measurement path pump, which is fluidly connected to the transportation pump and pumps at least one partial stream of the reaction fluid conveyed by the transportation path pump into the valve device for distributing the reaction fluid to the monitoring cell and to the reaction vessel.

5. The monitoring device as claimed in claim 4, wherein, in a flow path of the conveyed reaction fluid downstream of the transportation path pump, a first distribution piece is provided, which diverts a partial stream of the conveyed reaction fluid to the measurement path pump and another partial stream of the conveyed reaction fluid to the first return line from the distribution vessel to the reaction vessel, and wherein, in the flow path of the conveyed reaction fluid, a second distribution piece is positioned upstream of the first return line from the distribution device to the reaction vessel, which combines the partial stream of the conveyed reaction fluid to the first return line with another partial stream of the reaction fluid from the monitoring cell exiting the valve device, and provides said combined stream to the first return line from the distribution vessel to the reaction vessel.

6. The monitoring device as claimed in claim 1, wherein parts of the pump device and of the valve device moistened with the reaction fluid and an entire fluid path of the reaction fluid are composed of chemically inert materials.

7. The monitoring device as claimed in claim 1, wherein the pump device, the valve device, and an entire fluid path of the reaction fluid are composed of materials that are usable in an operating temperature range of −50° C. to +150° C. or −20° C. to +100° C.

8. The monitoring device as claimed in claim 4, wherein at least one pump of the electrically controlled pump device configured to pump the reaction fluid is configured to operate at a flow rate of between 10 ml/min and 1,000 ml/min.

9. The monitoring device as claimed in claim 4, wherein at least one pump of the electrically controlled pump device configured to pump the reaction fluid is configured to operate at a flow rate of between 0.1 ml/min and 10 ml/min.

10. The monitoring device as claimed in claim 1, wherein the control and regulating device for the electrical control of the pump device and for the electrical control of the valve device is configured to allow volume flow and independent control of the transportation path pump and the measurement path pump, depending on a course of the reaction in the reaction vessel.

11. The monitoring device as claimed in claim 1, wherein the control and regulating device configured to electrically control the pump device and to electrically control the valve device is configured to allow time-controlled and/or volume-controlled regulation of the valve device and/or the pump device, depending on a course of the reaction in the reaction vessel.

12. The monitoring device as claimed in claim 4, wherein, in the flow path of the conveyed reaction fluid, sensors are positioned at different, spatially separate sites, and wherein the sensors are configured to detect one or more of: current temperature, current pressure, current pH, or current flow rate of the reaction fluid, wherein the sensors are connected with the control and regulating device configured to electrically control the pump device and to electrically control the valve device, and wherein the control and regulating device is configured to allow one or more of: temperature-controlled, pressure-controlled, pH-controlled, or flow-rate-dependent regulation of the valve device and/or the pump device, depending on a course of the reaction in the reaction vessel.

13. The monitoring device as claimed in claim 1, wherein the distribution vessel is enclosed in a housing that is constructed in a thermally insulating manner.

14. The monitoring device as claimed in claim 4, further comprising a thermostat device configured to provide temperature control to an entire flow path of the conveyed reaction fluid from the reaction vessel via the distribution vessel to the monitoring cell and from the monitoring cell via the distribution vessel to the reaction vessel, wherein the control and regulating device configured to electrically control the pump device and to electrically control the valve device is configured to allow temperature control of the thermostat device, depending on a course of the reaction in the reaction vessel.

15. The monitoring device as claimed in claim 1, wherein the distribution vessel is spatially arranged to be closer to the monitoring cell than to the reaction vessel.

16. The monitoring device as claimed in claim 5, wherein the first distribution piece is a first T piece and the second distribution piece is a second T piece.

17. The monitoring device as claimed in claim 6, wherein the chemically inert materials are selected from the group consisting of: glass, PTFE (polytetrafluorethylene), PCTFE (polychlorotrifluoroethylene), and ETFE (ethylene tetrafluoroethylene).

18. The monitoring device as claimed in claim 8, wherein the at least one pump of the electrically controlled pump device is the transportation path pump, and wherein the transportation path pump is configured to operate at a flow rate of greater than 20 ml/min and up to 1,000 ml/min.

19. The monitoring device as claimed in claim 9, wherein the at least one pump of the electrically controlled pump device is the measurement path pump, and wherein the measurement path pump is configured to operate at a flow rate from 0.1 ml/min and up to 1 ml/min.

20. The monitoring device as claimed in claim 15, wherein a distance (D1) between the distribution vessel and the reaction vessel is twice, three times, or six times as large as a distance (D2) between the distribution vessel and the monitoring cell.

* * * * *